(12) United States Patent
Yu et al.

(10) Patent No.: US 9,142,675 B2
(45) Date of Patent: Sep. 22, 2015

(54) FIN FIELD EFFECT TRANSISTORS AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Yunchu Yu, Shanghai (CN); Yihua Shen, Shanghai (CN); Xiaohui Zhuang, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/463,707

(22) Filed: Aug. 20, 2014

(65) Prior Publication Data

US 2015/0171208 A1  Jun. 18, 2015

(30) Foreign Application Priority Data

Dec. 18, 2013  (CN) .......................... 2013 1 0698046

(51) Int. Cl.
  H01L 29/76  (2006.01)
  H01L 29/78  (2006.01)
  H01L 29/66  (2006.01)

(52) U.S. Cl.
  CPC ........ *H01L 29/785* (2013.01); *H01L 29/66795* (2013.01); *H01L 2029/7858* (2013.01)

(58) Field of Classification Search
  CPC ............ H01L 29/785; H01L 29/66795; H01L 2029/7858
  See application file for complete search history.

(56) References Cited

U.S. PATENT DOCUMENTS 8,853,015 B1 * 10/2014 Kuo et al. ..................... 438/151
2014/0273464 A1 * 9/2014 Shieh et al. ................... 438/700

* cited by examiner

*Primary Examiner* — Shaun Campbell
(74) *Attorney, Agent, or Firm* — Anova Law Group, PLLC

(57) ABSTRACT

A method is provided for fabricating a fin field-effect transistor. The method includes providing a substrate having a first region and a second region; and forming a plurality of fin structures on a surface of the substrate. The method also includes forming a first mask layer having a plurality of first openings exposing the fin structures in the first region near the second region; and removing the fin structures in the first region near the second region. Further, the method includes forming a second mask layer on the fin structures in the second region; and removing the fin structures in the first region. Further, the method also includes forming fins by etching the substrate using the fin structures in the second region as an etching mask; and forming a gate structure and source/drain regions in the fins at both sides of the gate structure.

15 Claims, 11 Drawing Sheets

FIN FIELD EFFECT TRANSISTORS AND FABRICATION METHOD THEREOF

CROSS-REFERENCES TO RELATED APPLICATIONS

This application claims the priority of Chinese patent application No. 201310698046.0, filed on Dec. 18, 2013, the entirety of which is incorporated herein by reference.

FIELD OF THE INVENTION

The present invention generally relates to the field of semiconductor manufacturing technology and, more particularly, relates to fin field-effect transistors and fabrication techniques thereof.

BACKGROUND

With the development of the semiconductor manufacturing technology, technical nodes have consistently decreased, the high-K/metal gate technology have been widely used. A desired threshold voltage has been obtained by forming a metal layer with a different work function between the high dielectric constant (high-K) dielectric layer and the metal gate structure of the high-K/metal gate structure. However, when the critical dimension (CD) is further reduced, the structures of conventional MOS field effect transistors (MOSFETs) are unable to match requirements of the device performance. Fin field-effect transistors (FinFET) have attracted extensive attentions because they may substitute the conventional devices.

FIG. 1 illustrates an existing FinFET. As show in FIG. 1, the FinFET includes a semiconductor substrate 10 and a protruding fin 14 formed on the semiconductor substrate 10. The fin 14 may be formed by etching the semiconductor substrate 10. The FinFET also includes a first dielectric layer 11 covering a surface of the semiconductor substrate 10 and a portion of side surfaces of the fin 14, and a metal gate structure 12 stretching across the fin 14 and covering the top and side surfaces of the fin 14. The metal gate structure 12 includes a high-K dielectric layer (not shown) on the side and top surface of the fin 14; a metal gate electrode (not shown) formed on the high-K dielectric layer; and a second dielectric layer (not shown) covering the first dielectric layer 11 and the fin 14. The surface of the second dielectric layer levels with the surface of the metal gate structure 12.

However, when the technical node of the FinFET is further reduced, the performance of the FinFET may need further improvement. The disclosed device structures and methods are directed to solve one or more problems set forth above and other problems.

BRIEF SUMMARY OF THE DISCLOSURE

One aspect of the present disclosure includes a method for fabricating a fin field-effect transistor. The method includes providing a substrate having a first region and a second region; and forming a plurality of fin structures on a surface of the substrate. The method also includes forming a first mask layer having a plurality of first openings exposing the fin structures in the first region near the second region on the fin structures and the surface of the substrate; and removing the fin structures in the first region near the second region. Further, the method includes forming a second mask layer on the fin structures in the second region to cover the fin structures in the second region and expose the fin structures in the first region; and removing the fin structures in the first region. Further, the method also includes forming fins by etching the substrate using the fin structures in the second region as an etching mask; and forming a gate structure stretching over the fins in the second region and source/drain regions in the fins at both sides of the gate structure.

Another aspect of the present disclosure includes a fin field-effect transistor. The fin field-effect transistor includes a substrate having a first region and second region; and a plurality of fins formed on the substrate in the second region. Further, the FinFET also includes a gate structure stretching over on the fins formed on the fins; and source/drain regions formed in the fins at both sides of the gate structure. wherein the fins are formed by forming a plurality of fin structures on a surface of the substrate; forming a first mask layer having a plurality of first openings exposing the fin structures in the first region near the second region on the fin structures and the surface of the substrate; removing the fin structures in the first region near the second region; forming a second mask layer on the fin structures in the second region to cover the fin structures in the second region and expose the fin structures in the first region; removing the fin structures in the first region; and forming fins by etching the substrate using the fin structures in the second region as an etching mask.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
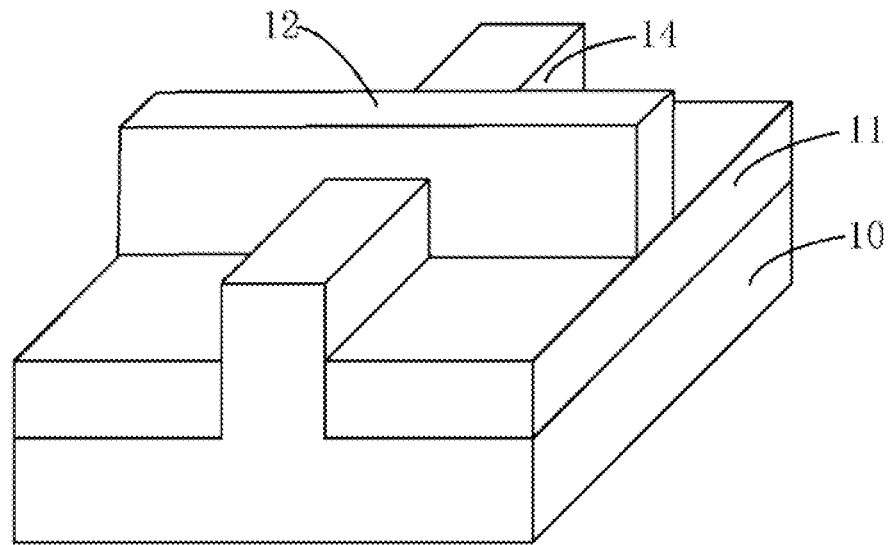
FIG. 1 illustrates a three dimensional structure of an existing fin field-effect transistor.
Figure 2:
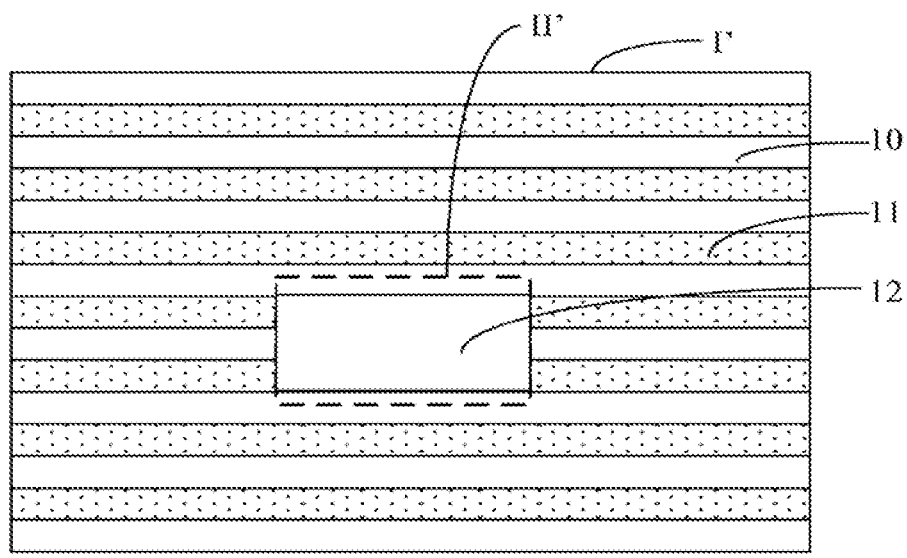
FIGS. 2-3 illustrate semiconductor structures corresponding to certain stages of an existing fabrication process of a fin field-effect transistor.
Figure 3:
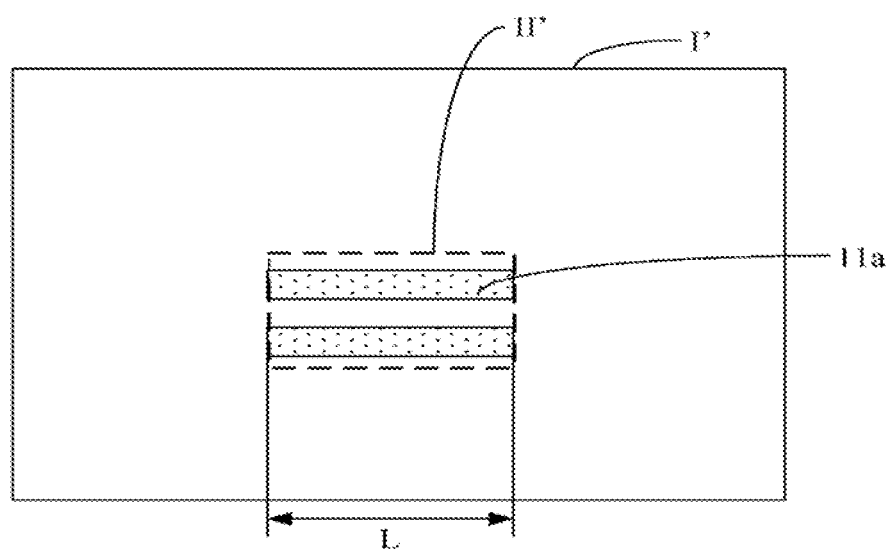

As shown in FIGS. 2-3, an existing fabrication process of a fin field-effect transistor (FinFET) may include forming a plurality of the fin structures 11 on the surface of the substrate 10. The surface of the substrate has a first region I' and second region II'. The method also includes forming a mask layer 12 covering the fin structures 11 in the second region II' and exposing the fin structures 11 in the first region I'. Further, the method includes etching the fin structures 11 in first region I' using the mask layer 12 as an etching mask. Therefore, the fins 11a are formed in the second region II' and the fin structure 11 in the first region I' are removed.

However, when the fin structures 11 are etched using the mask layer 12 as an etching mask, because the patterns in a mask for forming the mask layer 12 may be complex and various, the patterns in the formed mask layer 12 may also be complex. Further, due to the limitation of the photolithography process, certain phenomena, such as corner rounding, etc., may exist, and the pattern quality may be unacceptable. Thus, the fin structures 11 in the second region II may also be etched. In certain examples, the fin structures 11 may be broken along the longitudinal direction, and/or the length "L" of the fin structures 11 may not match the requirements. For example, the actual length may be longer than the designed length, or may be shorter than the designed length. Therefore, the quality of the subsequently formed fins along the length "L" direction may be relatively poor; and the stability of the subsequently formed FinFETs having the fins may be unable to match the desired requirements. However, according to the disclosed processes and structures, the stability issues may be overcome by forming the fin structures using two mask layers.

Figure 4:
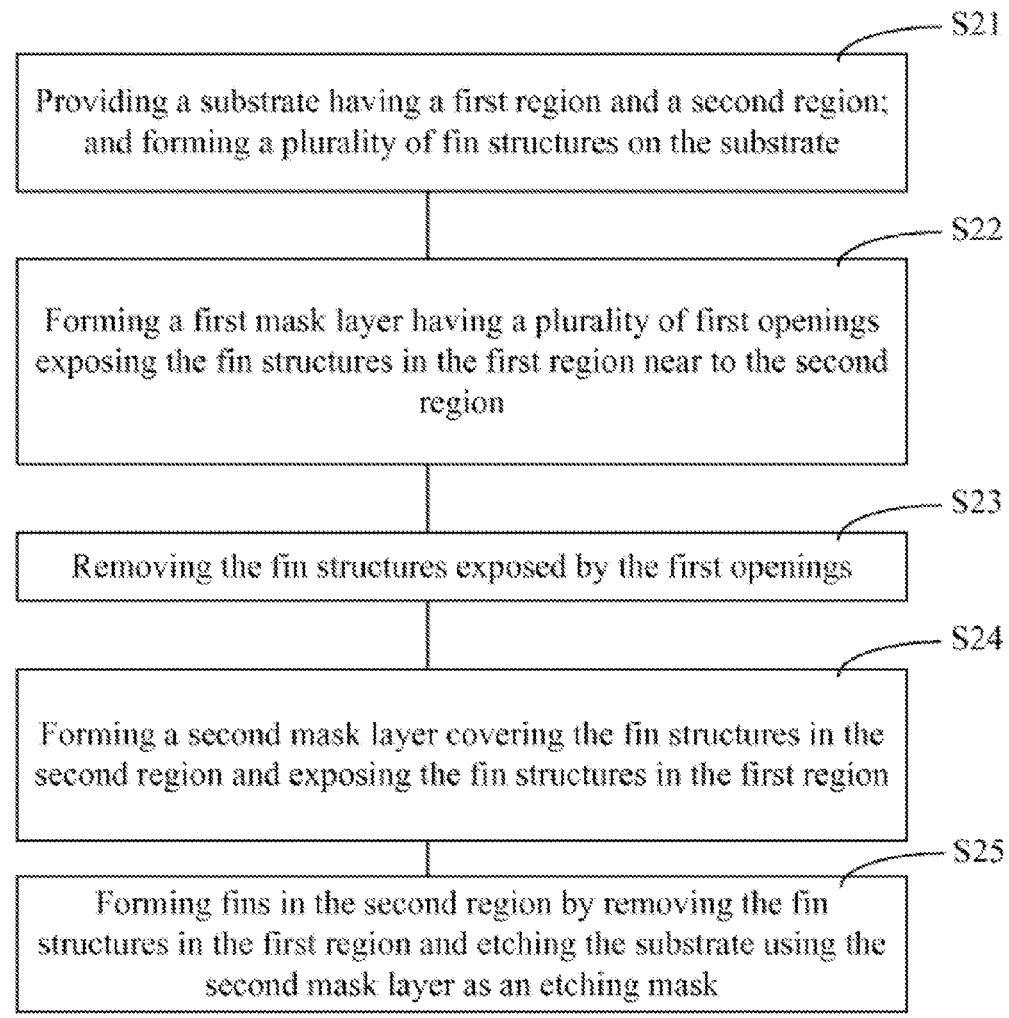
FIG. 4 illustrates an exemplary fabrication process of a fin field-effect transistor consistent with the disclosed embodiments.

FIG. 4 illustrates an exemplary fabrication process of a fin field-effect transistor (FinFET) consistent with the disclosed embodiments; and FIGS. 5-18 illustrate exemplary semiconductor structures corresponding to various stages of the exemplary fabrication process.

Figure 5:
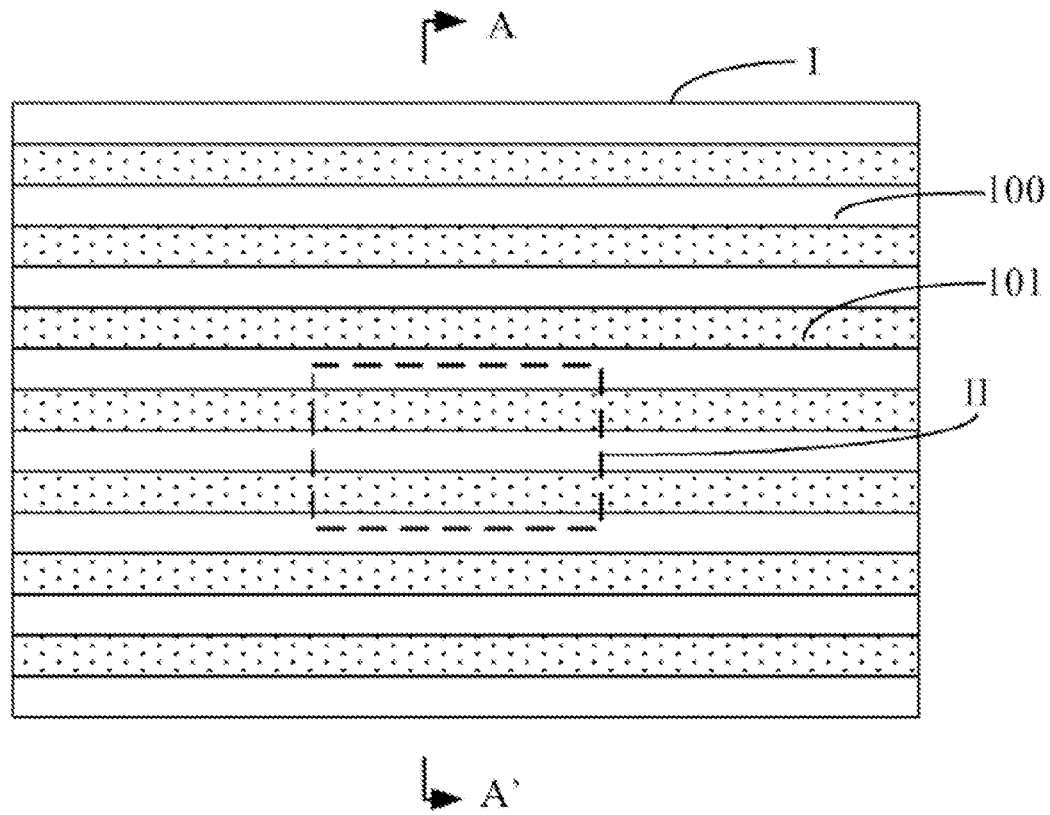
FIGS. 5-13, 14A-14B, and 15-18 illustrate semiconductor structures corresponding to certain stages of the existing fabrication process of a fin field -effect transistor consistent with the disclosed embodiments.
Figure 6:
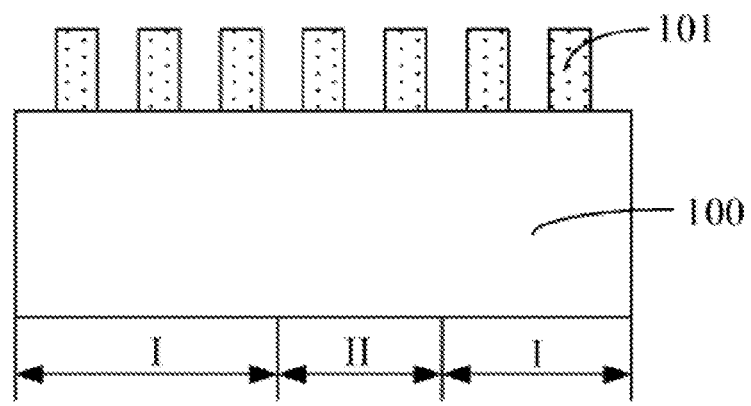

As shown in FIG. 4, at the beginning of the fabrication process, a semiconductor substrate with certain structures is provided (S21). FIGS. 5-6 illustrate a corresponding semiconductor structure; and FIG. 6 illustrates a cross-section view of the semiconductor structure illustrated in FIG. 5 along an AA' direction.

As shown in FIGS. 5~6, a substrate 100 is provided. The substrate 100 may have a first region I and a second region II. Further, a plurality of fin structures 101 may be formed on the surface of the substrate 100. The fin structures 101 in the first region I may be subsequently removed; and the fin structures 101 in the second region II may be used to subsequently form the fins of FinFETs.

The substrate 100 may include any appropriate semiconductor materials, such as silicon, silicon on insulator (SOI), silicon germanium, carborundum, indium antimonide, lead telluride, indium arsenide, indium phosphide, gallium arsenidie, gallium antimonite, alloy semiconductor or a combination thereof. In one embodiment, the semiconductor substrate 100 is silicon or SOI. The substrate 100 provides a base for subsequent processes and structures.

In one embodiment, the fin structures 101 in the second region II may be used as a mask to etch the substrate 100 to subsequently form fins in the substrate 100. Thus, the fin structures 101 may be made of any appropriate material, such as silicon oxide, silicon nitride, or silicon oxynitride, etc. In one embodiment, the fin structures 101 are a hard mask made of silicon nitride.

The fin structures 101 configured as a mask for subsequently forming fins may be formed by forming a fin structure layer on the substrate 100; and followed by forming the fin structures 101 by etching the fin structure layer. The fin structure layer may be formed by any appropriate process, such as a chemical vapor deposition (CVD) process, a physical vapor deposition (PVD) process, or an atomic layer deposition (ALD) process, etc. The fin structure layer may be etched by a dry etching process, a wet etching process or an ion beam etching process, etc., using a mask. The mask may be photoresist mask, or a shadow mask, etc.

In certain other embodiments, the fin structures 101 may be directly used to form fins of FinFETs. Thus, the fin structures 101 may be made of any appropriate semiconductor materials, such as silicon, silicon germanium, or germanium arsenic, etc.

The fin structures 101 configured for directly forming the fins may be formed by etching the substrate 100 by any appropriate process, such as a dry etching process, a wet etching process, or an ion beam etching process, etc. The mask for the etching process may be a photoresist mask, or a shadow mask, etc.

Figure 7:
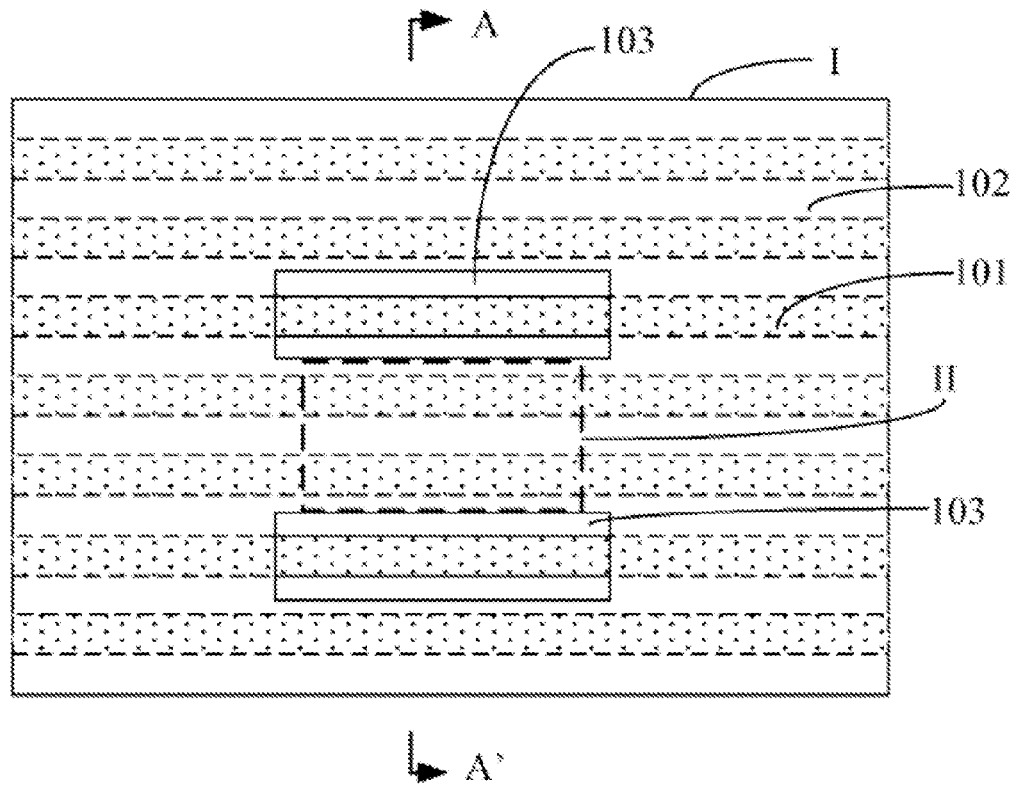
Figure 8:
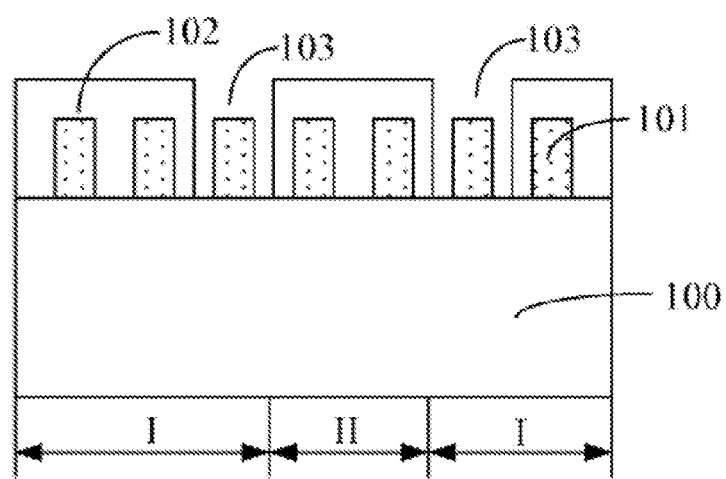

Returning to FIG. 4, after providing the substrate 100 and forming the fin structures 101, a first mask layer with first openings may be formed (S22). FIGS. 7-8 illustrate a corresponding semiconductor structure; and FIG. 8 illustrates a cross-section view of the semiconductor structure illustrated in FIG. 8 along the AA' direction.

As shown in FIGS. 7-8, a first mask layer 102 is formed on the surface of the fin structures 101 and the substrate 100. A plurality of first openings 103 may be formed in the first mask layer 102. For illustrative purposes, two first openings 103 are used in the description. The first openings 103 may have any appropriate shape. In one embodiment, each of the first openings 103 is a single rectangle. In certain other embodiments, each of the first openings 103 may include a plurality of single rectangles. The long side of the first openings 103 may be same as the length direction of the fin structures 101. Further, the first openings 103 may expose the first fins 101 in the first region I near to the fin structures 101 in the second region II. The first mask 102 with the first openings 103 may be referred as a clear tone cut mask.

Referring to FIG. 2, as described earlier, if the fins 11a are formed by etching the fin structures 11 in the second region II' using the mask layer 12 directly, the complex patterns with a poor quality may significantly affect the quality of the subsequently formed fins 11a; and the stability of the performance of the FinFET may be unable to match the expectations. In the disclosed embodiment, the first mask layer 102 having a relatively good pattern quality may be formed firstly, and may be used to remove a portion of the fin structures 101 in first region I around the second region II so as to well protect the fin structures 101 in the second region II. A second mask layer may be subsequently formed; and may be used as a mask for removing the remained fin structures 101 in the first region I. Thus, even if the patterns in the second mask may be complex and/or the quality is relatively poor, the removing process may not damage the fin structures 101 in the second region II. Further, a double patterning layout may be converted to clear tone cut mask from original dark tone, thus the double patterning process may be simplified, and the overall number of steps required to produce an integrated circuit is generally decreased Referring to FIGS. 7-8, the first mask layer 102 may be used to remove the portion fin structures 101 in the first region I near to the second region II, thus the fin structures 101 in the second region II may be kept intact. Further, the openings 103 in the first mask layer 102 may be rectangular; the quality of the side surface of the openings 103 may match the desired requirements; and the shape of the openings 103 may be uniform and regular. Further, the first openings 103 may only expose the portion fin structures 101 in the first region I around the second region II; and may not expose the fin structures 101 in the second region II. Therefore, when an etching process is subsequently performed along such openings, the fin structures 101 in the second region II may not be damaged, and may be kept intact.

The first mask layer 102 may be made of any appropriate material, such as silicon oxide, silicon nitride, silicon oxynitride, or photoresist, etc. In one embodiment, the first mask layer 102 is made of photoresist. Various processes may be used to form the first mask layer 102, such as a CVD process, a PVD process, an ALD process, a flowable CVD (FCVD) process, or a spin-coating process, etc. In one embodiment, the first mask layer 102 is made of photoresist, thus the first mask layer 102 may be formed by spin-coating a photoresist layer; and followed by an exposing and developing process.

For illustrative purposes, referring to FIG. 7, the lateral direction of FIG. 7 may also be referred as the length direction of the fin structures 101, the direction of the long side of the first openings 103 and the length direction of the second region II. The vertical direction of FIG. 7 may also be referred as the width direction of the fin structures 101, the direction of the short side of the first openings 103 and the width direction of the second region II.

To better prevent the fin structures 101 in the second region II from being etched, referring to FIG. 7, the long side of the first openings 103 may be parallel to the fin structures 101; and the length of the long side of the first openings 103 may be greater than the length of the second region II. Further, the short side of the first openings 103 may be at least greater than the width of the fin structure 101. In one embodiment, the length of the first opening 103 may be slightly greater than the length of the second region II, such a length may prevent the fin structures 101 in the second region II from being affected by subsequent processes.

Further, the length of the short side of the first openings 103 may be equal to the pitch of the fin structures 101. Such a length may aid to form the short side of the first openings 103 between adjacent fin structures 101; and may aid to perform subsequent processes. For example, in one embodiment, the length of the second region II may be approximately 40 nm, the pitch may be approximately 10 nm, thus the length of the long side of the first openings 103 may be approximately 50 nm; and the length of the short side of the first openings 103 may be approximately 10 nm.

In certain other embodiments, the length of the short side of the first openings 103 may be an integer time of the pitch. For example, if the pitch of the fin structures 101 is approximately 10 nm, the length of the short side of the first openings 103 may be approximately 20 nm, 30 nm, etc.

Figure 9:
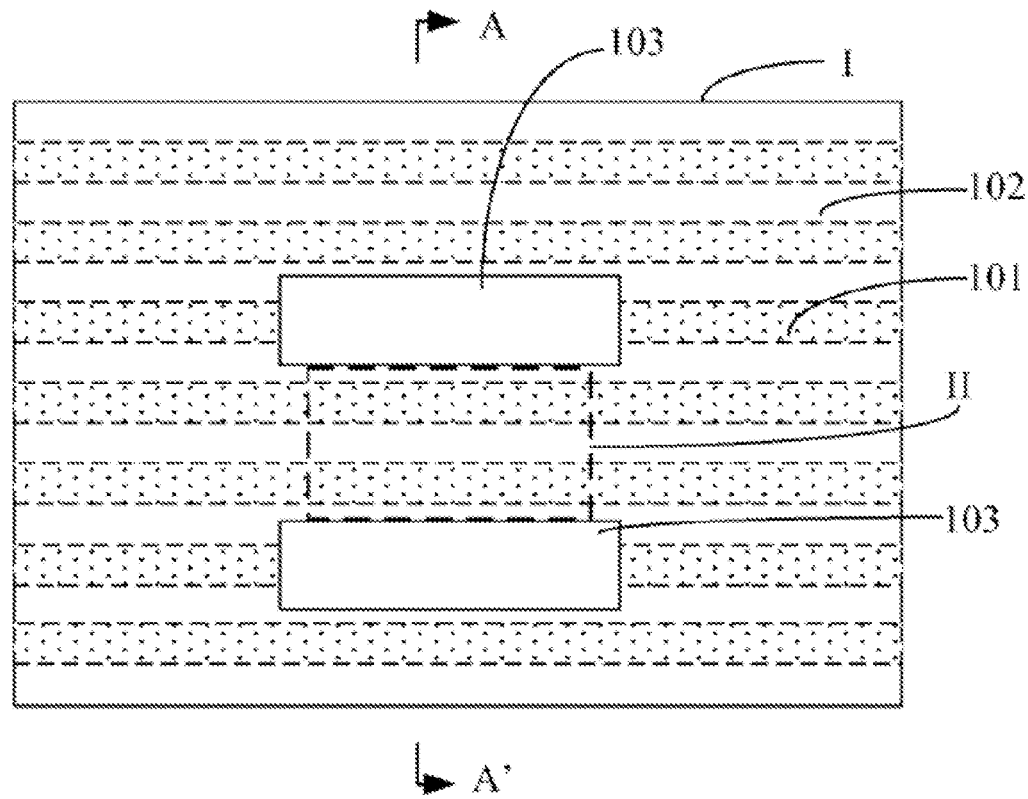
Figure 10:
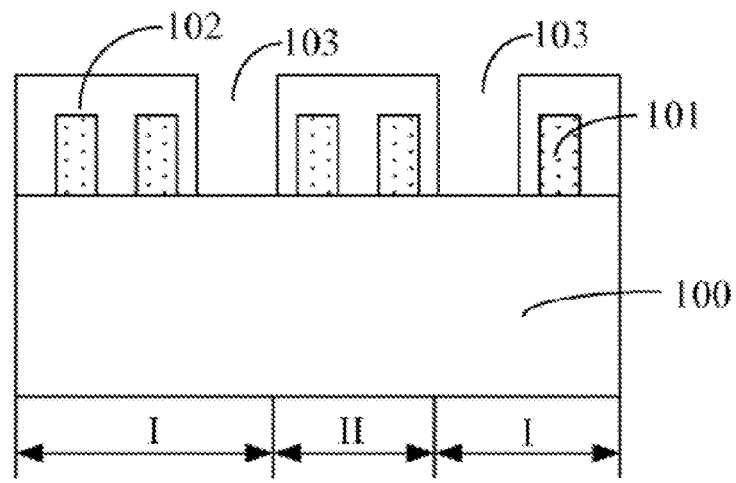

Returning to FIG. 4, after forming the first mask layer 102 with the first openings 103, the fin structures 101 exposed by the first openings 103 may be removed (S23). FIGS. 9~10 illustrate a corresponding semiconductor structure; and FIG. 10 illustrates a cross-section view of the semiconductor structure illustrated in FIG. 9.

As shown in FIGS. 9~10, the fin structures 101 exposed by the first openings 103 are removed and the surface of the substrate 100 is exposed by the first openings 103. The fin structures 101 exposed by the first openings 103 may be removed by an etching process. Removing the fin structures 101 exposed by the first openings 103 may aid to perform subsequent processes. Various etching processes may be used to remove the fin structures 103 exposed by the first openings 103, such as a dry etching process, a wet etching process, or an ion beam etching process, etc.

Figure 11:
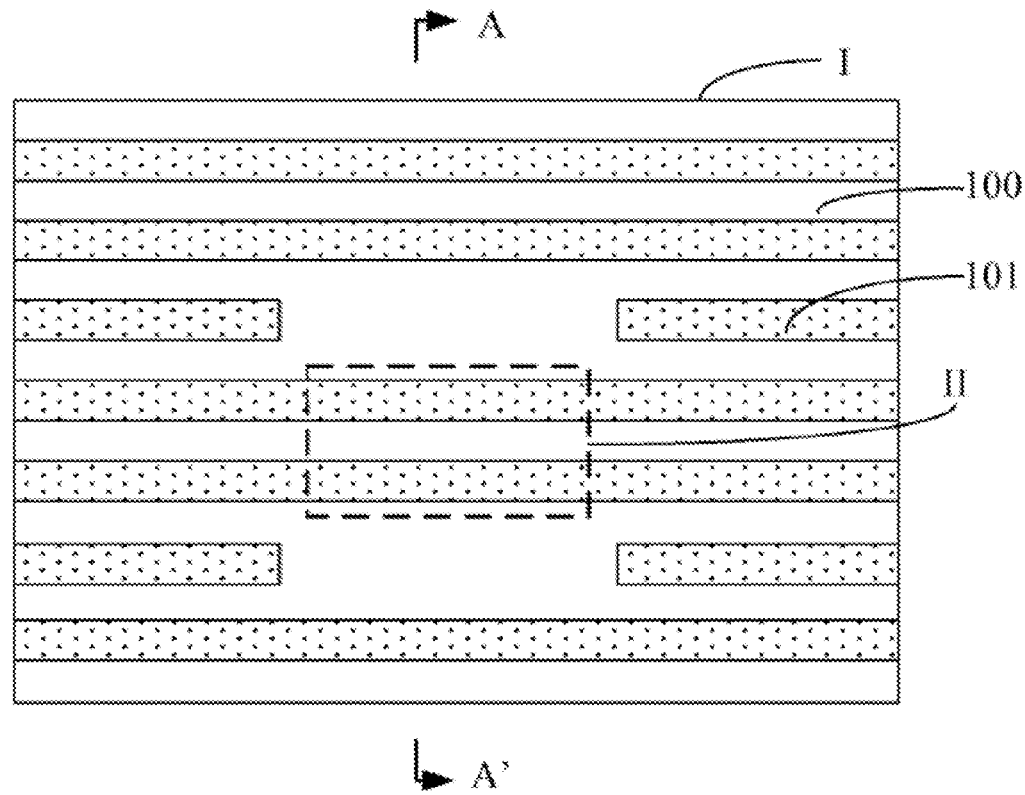
Figure 12:
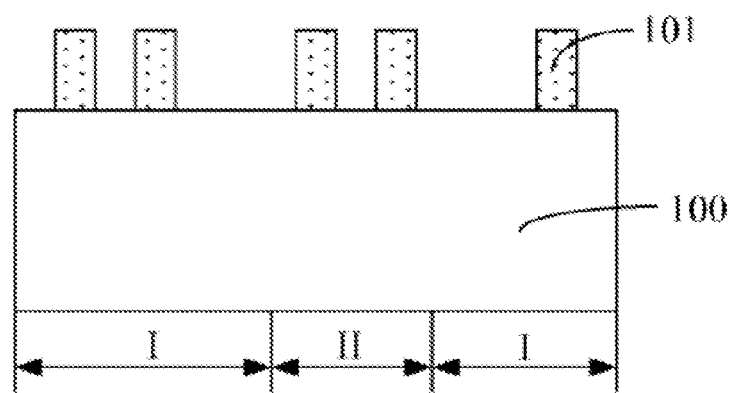

Further, as shown in FIGS. 11~12, after removing the fin structures 101 exposed by the first openings 103, the first mask layer 102 may be removed. Various processes may be used to remove the first mask layer 102, such as a dry etching process, a wet etching process, or a plasma ashing process, etc.

In certain other embodiments, the first mask layer 102 may be kept; and a second mask layer may be subsequently formed on the first mask layer 102. After subsequently removing the fin structures 101, the first mask layer 102 and the second mask layer may be removed by a same process.

Figure 13:
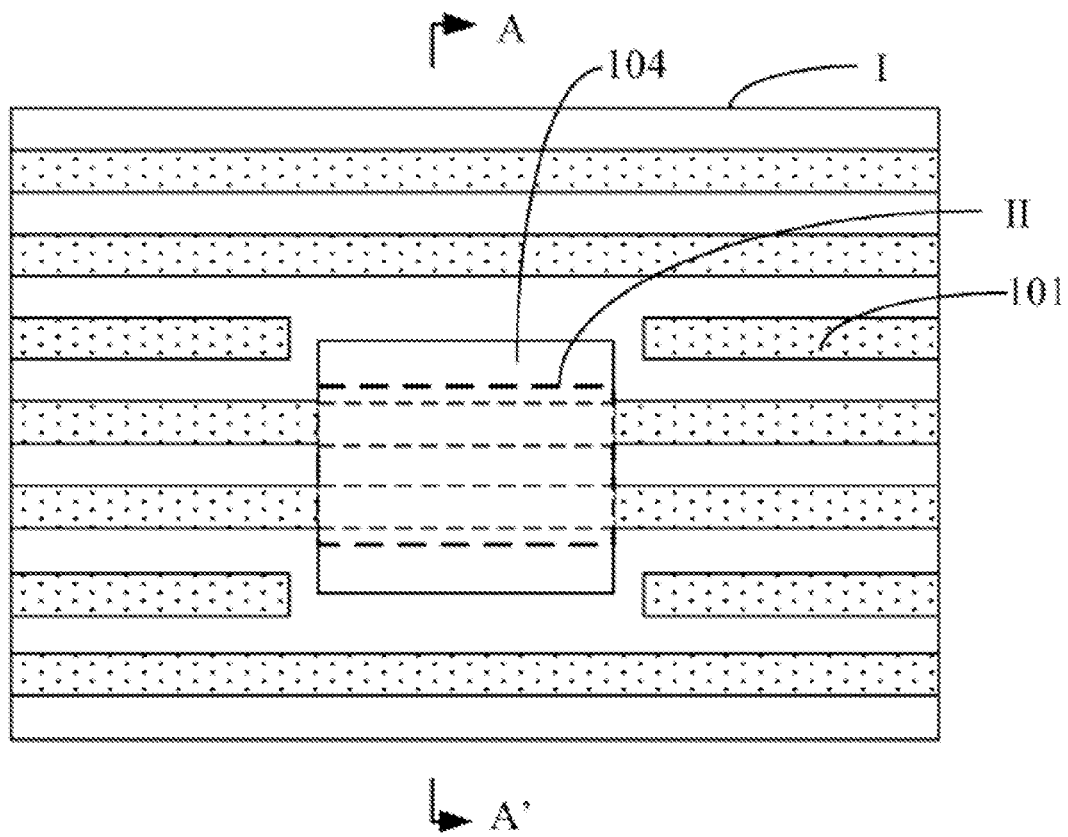
Figure 14A:
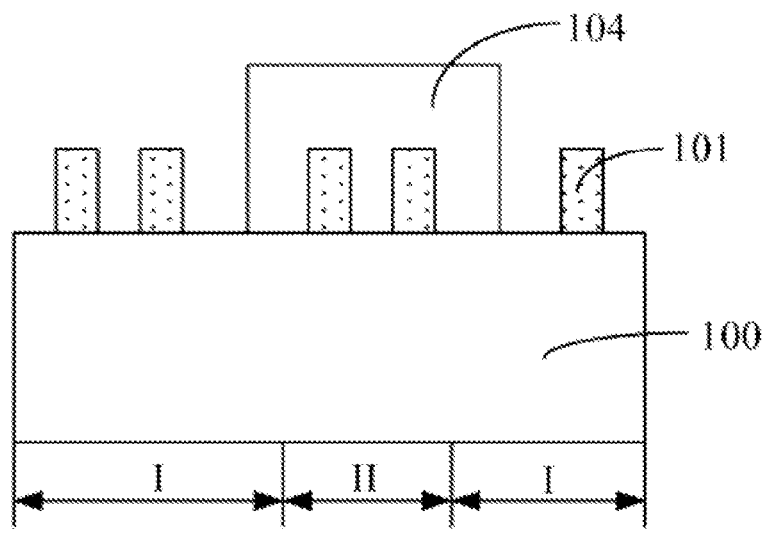

Returning to FIG. 4, after removing the first mask layer 102, a second hard mask layer may be formed (S24). FIGS. 13 and 14A illustrate a corresponding semiconductor structure;

and FIG. 14A illustrates a cross-section view of the semiconductor illustrated in FIG. 13 along the AA' direction.

As shown in FIGS. 13-14A, a second mask layer 104 is formed on the surface of the fin structures 101 in the second region II. The fin structures 101 in the first region I may be exposed by the second mask layer 104. The second mask layer 104 may be used to remove the fin structures 101 in the first region 1.

As described above, a portion of the fin structures 101 in the first region I near to the second region II may be removed by an etching process using the first mask layer 103 as an etching mask, thus factors that may affect the quality of the fin structures 101 in the second region II may be eliminated. Therefore, the second mask layer 104 may only need to cover the fin structures 101 in the second region; and expose the remaining fin structures 101, the complexity and the quality of the second mask layer 104 may not significantly affect the quality of the subsequently formed fins.

The length of the second mask layer 104 may be any appropriate value. In one embodiment, in order to cause the length of the subsequently formed fins to match the desired requirements, the length of the second mask layer 104 may be equal to the length of the second region II. The width of the second mask layer 104 may be equal to; or greater than the width of the second region II. Such a width may better protect the quality of the sidewalls of the fin structures 101 along the length direction. For example, if the length of the second region II is approximately 40 nm, the width of the second region II is approximately 30 nm, thus the length of the second mask layer 104 may be approximately 40 nm; and the width of the second mask layer 104 may be approximately 40 nm.

Figure 14B:
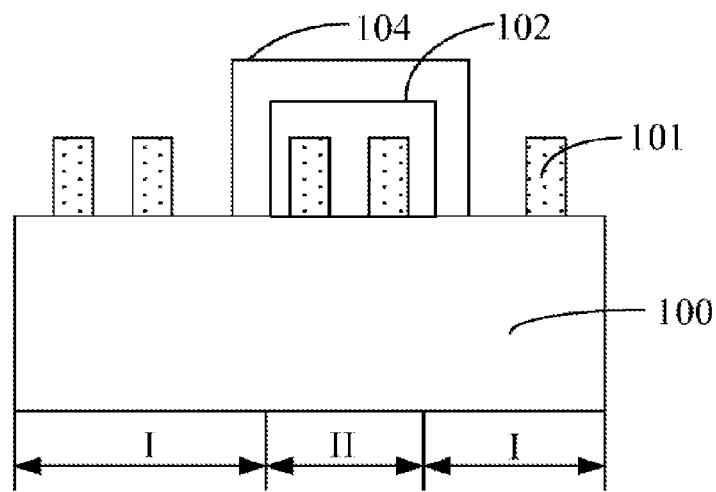

In certain other embodiments, if the second mask layer 104 is directly formed on the first mask layer 102, for example, as shown in FIG. 14B, a portion of the second mask layer 104 may be formed in the first openings 103 in the first mask layer 102.

The second mask layer 104 may be made of any appropriate material, such as silicon oxide, silicon nitride, silicon oxynitride, or photoresist etc. Various processes may be used to form the second mask layer 104, such as a CVD process, a PVD process, a spin-coating process, or an FCVD process, etc.

Figure 15:
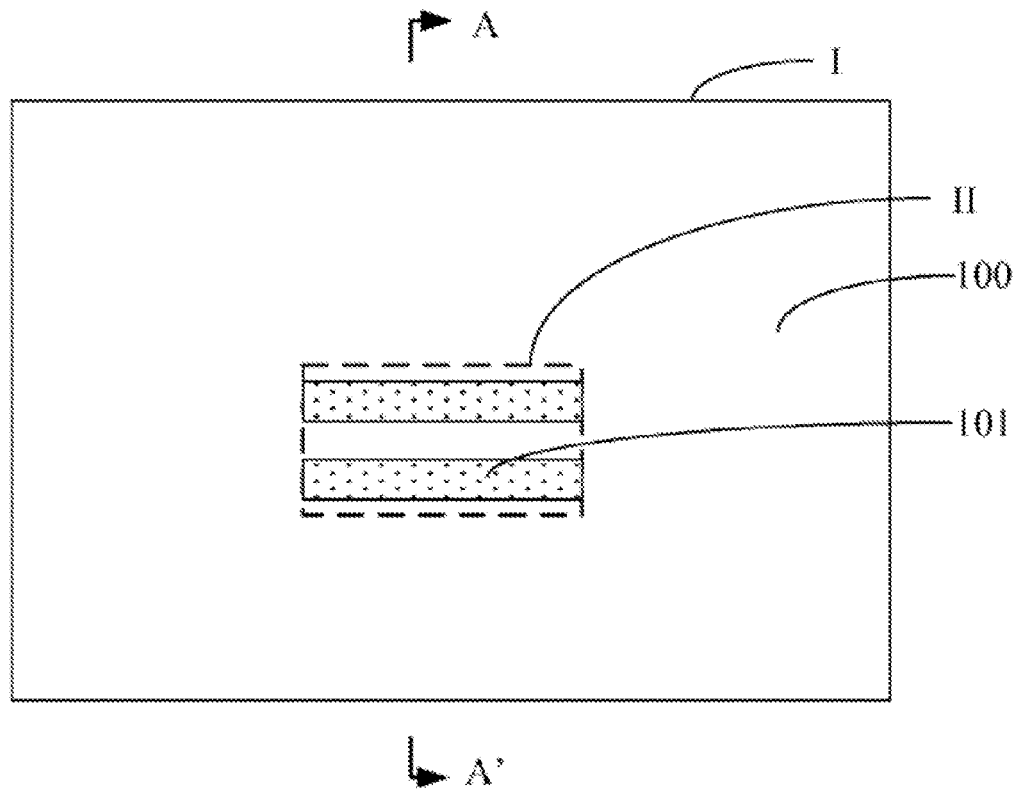
Figure 16:
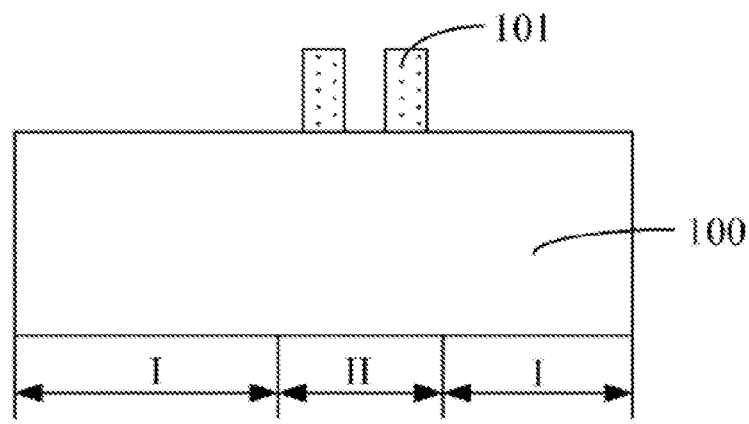

Returning to FIG. 4, after forming the second mask layer 104, the fin structures 101 in the first region I may be removed (S25). FIGS. 15~16 illustrate a corresponding semiconductor structures; and FIG. 16 illustrates a cross-section view of the semiconductor structure illustrated in FIG. 15.

As shown in FIGS. 15~16, the remaining fin structures 101 in the first region I are removed; and the fin structures 101 in the second region II are kept to be configured as the fins of subsequently formed transistors. Various processes may be used to remove the remaining fin structures 101 in the first region I, such as a dry etching process, a wet etching process, or an ion beam etching process, etc. In one embodiment, the fin structures 101 in the first region I are removed by a dry etching process.

Because a portion of the fin structures 101 in the first region I near to the second region II may have been removed by previous processes, and the fin structures 101 may be well protected, thus during the process removing the remaining fin structures 101 in the first region I, the factors affecting the quality of the fin structures 101 in the second region II may be eliminated. Thus, the quality of the subsequently form fins may match the desired requirements; and the stability of the subsequently formed FinFETs having such fins may be improved.

In one embodiment, the fins structures 101 in the second region II may be used as an etching mask for subsequently forming fins by etching the substrate 100. In certain other embodiments, if the fin structures 101 are made of semiconductor material, the fin structures 101 in the second region II may be directly used as the fins of the subsequently formed finFETs.

Further, after removing the fin structures 101 in the first region I, fins 105 may be formed in the second region II. The fins 105 may be formed by etching the substrate 100 using the fin structures 101 in the second region II. The fins 105 may be formed by any appropriate process, such as a dry etching process, or a wet etching process, etc. In certain other embodiments, if the fin structures 101 are made of semiconductor material, the fin structures 101 in the second region I may be directly used as the fins 105, and the etching process may be omitted.

Further, after forming the fins 105, subsequent processes may be performed to form FinFETs based on the fins 105. The subsequent processes may include forming gate structures stretching over the fins 105. That is, the gate structures may be perpendicular to the length direction of the fins 105. The subsequent processes may also include forming source/drain structures at both sides of the gate structures in the fins 105.

Figure 17:
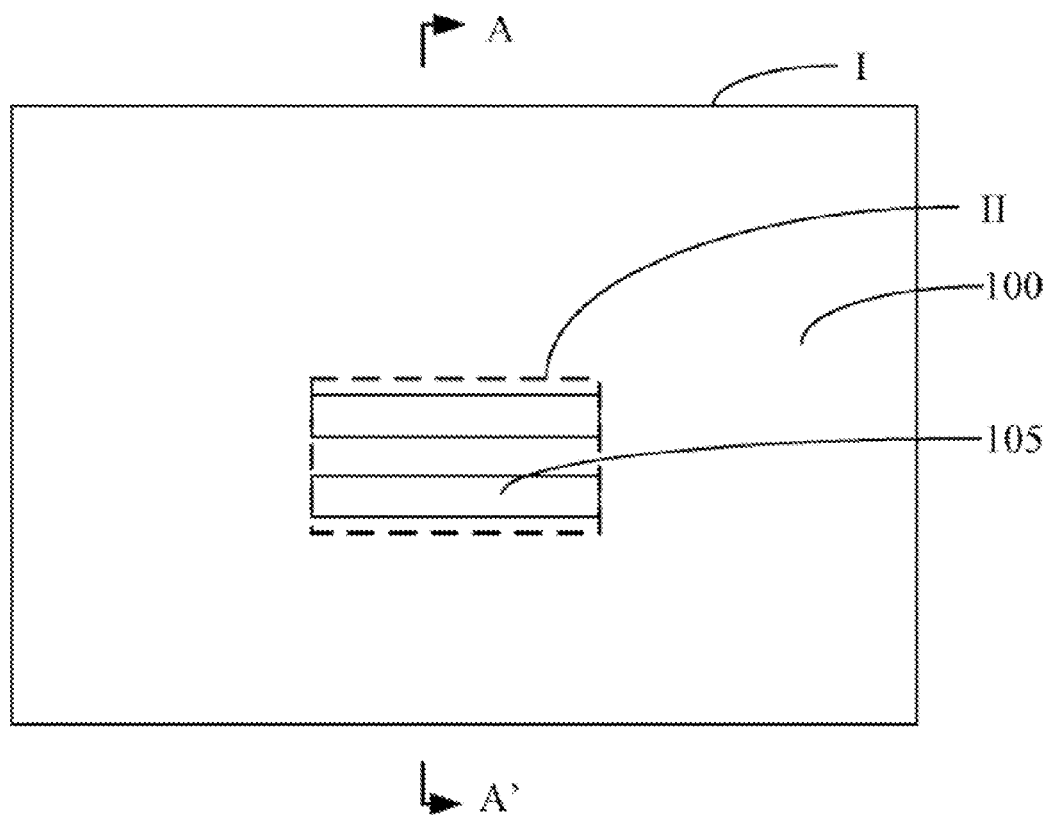
Figure 18:
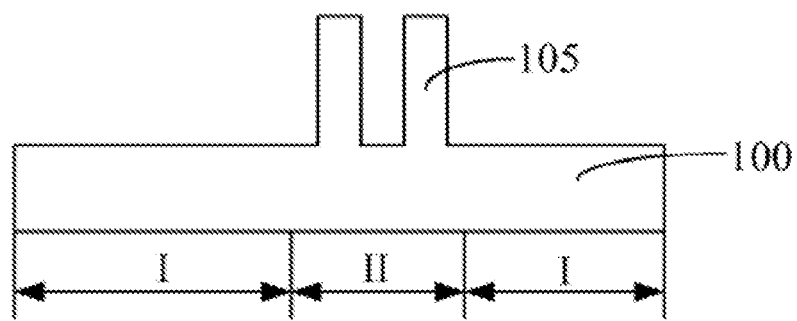

Thus, a FinFET may be formed by the above-disclosed processes and methods, the corresponding FinFET is shown in FIGS. 17~18. The FinFET includes a semiconductor substrate 100 having a first region I and a second region II; and a plurality of fins 105 formed on the surface of the substrate 100 in the second region II. The FinFET also includes a gate structure (not shown) stretching over the fins 105. Further, the FinFET includes source/drain regions formed in the fins 105 at both sides of the gate structure. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a fin field-effect transistor, comprising:
    providing a substrate having a first region and a second region;
    forming a plurality of fin structures on a surface of the substrate in the first region and the second region;
    forming a first mask layer on the fin structures and on the surface of the substrate, wherein the first mask layer has a plurality of first openings exposing fin structure portions in the first region next to the second region;
    removing the fin structure portions exposed in the first region next to the second region;
    forming a second mask layer on the first mask layer that is on the fin structures in the second region to cover the fin structures in the second region and to expose remaining fin structures in the first region;
    removing the remaining fin structures in the first region to leave the fin structures in the second region;
    forming fins by etching the substrate using the fin structure in the second region as an etching mask; and
    forming a gate structure stretching over the fins in the second region and source/drain regions in the fins at both sides of the gate structures.

2. The method according claim 1, wherein:
    the first mask layer is made of photoresist.

3. The method according to claim 2, wherein forming the first mask layer having the first openings further includes:
    forming a photoresist layer on the fin structures; and
    exposing and developing the photoresist layer to form the first openings.

4. The method according to claim 1, wherein:
    the first opening is a single rectangle or a shape formed by a plurality of single rectangles.

5. The method according to claim 1, wherein:
    a length of a long side the first opening is equal to or greater than a length of the second region.

6. The method according to claim 1, wherein:
    a length of a short side of the first opening is at least greater than a width of the fin structure.

7. The method according to claim 1, wherein:
    a length of a short side of the first opening is equal to an integer times the pitch of the fin structures.

8. The method according to claim 1, wherein:
    a length of the second mask layer is equal to a length of the second region; and
    a width of the second mask layer is greater than a width of the second region.

9. The method according to claim 1, wherein:
    the fin structures are formed from a hard mask layer.

10. The method according to claim 1, wherein:
    the fin structures are made of semiconductor material.

11. The method according to claim 1, after removing the remaining fin structures in the first region, further including:
    removing the second mask layer.

12. The method according to claim 1, after removing the remaining fin structures in the first region, further including:
    removing the first mask layer and the second mask layer simultaneously.

13. The method according to claim 1, wherein the plurality of fin structures are configured in parallel on an entire surface of the substrate, and each fin structure has a stripe shape.

14. the method according to claim 1, wherein the first region encloses the second region.

15. The method according to claim 1, wherein the second mask layer is formed to cover all the fin structures in the second region.

* * * * *